(12) United States Patent
Kikuchi

(10) Patent No.: US 10,334,090 B2
(45) Date of Patent: Jun. 25, 2019

(54) ELECTRONIC DEVICE

(71) Applicant: Sharp Kabushiki Kaisha, Sakai, Osaka (JP)

(72) Inventor: Masayuki Kikuchi, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/063,294

(22) PCT Filed: Oct. 11, 2016

(86) PCT No.: PCT/JP2016/080144
§ 371 (c)(1),
(2) Date: Jun. 18, 2018

(87) PCT Pub. No.: WO2018/069978
PCT Pub. Date: Apr. 19, 2018

(65) Prior Publication Data
US 2018/0375976 A1    Dec. 27, 2018

(51) Int. Cl.
*H04M 1/02* (2006.01)
*H01L 27/32* (2006.01)
*H01L 51/52* (2006.01)

(52) U.S. Cl.
CPC .......... *H04M 1/0216* (2013.01); *H04M 1/02* (2013.01); *H04M 1/0268* (2013.01); *H01L 27/323* (2013.01); *H01L 27/3244* (2013.01); *H01L 51/5253* (2013.01); *H01L 2251/5338* (2013.01)

(58) Field of Classification Search
CPC . H04M 1/0216; H04M 1/0268; H01L 27/323; H01L 27/3244; H01L 51/5253; H01L 2251/5338
See application file for complete search history.

(56) References Cited

U.S. PATENT DOCUMENTS 9,348,450 B1 * 5/2016 Kim ...................... G06F 1/1681
2014/0123436 A1 * 5/2014 Griffin ................ H04M 1/0216
16/221

(Continued)

FOREIGN PATENT DOCUMENTS

JP        2003-283621 A    10/2003
JP        2014-68288 A     4/2014
(Continued)

OTHER PUBLICATIONS

Official Communication issued in International Patent Application No. PCT/JP2016/080144, dated Dec. 20, 2016.

*Primary Examiner* — Simon Nguyen
(74) *Attorney, Agent, or Firm* — Keating & Bennett, LLP

(57) ABSTRACT

An electronic device includes a first housing, a second housing, a first hinge that is flexible and connects the first and the second housings, and a display panel that is continuously flexible. The first hinge overlaps with a first housing wall of the first housing and a second housing wall of the second housing. The first housing includes a first magnetic body. The second housing includes a second magnetic body. When the first hinge is in an open state, causing the first housing and the second housing to be disposed side-by-side, a magnetic force in a first direction is produced between the first magnetic body and the second magnetic body.

23 Claims, 12 Drawing Sheets

(56) References Cited

U.S. PATENT DOCUMENTS

| | | | |
|---|---|---|---|
| 2015/0233162 A1* | 8/2015 | Lee | H04M 1/02 16/223 |
| 2016/0007441 A1 | 1/2016 | Matsueda | |
| 2016/0070303 A1* | 3/2016 | Lee | G06F 1/1616 361/679.27 |
| 2016/0109908 A1* | 4/2016 | Siddiqui | G06F 1/1618 361/679.27 |
| 2016/0116943 A1* | 4/2016 | Becze | G06F 3/1438 455/575.3 |
| 2016/0275648 A1* | 9/2016 | Honda | G06F 3/16 |
| 2017/0272559 A1* | 9/2017 | Cavallaro | H04M 1/0268 |
| 2017/0357289 A1* | 12/2017 | Ahn | H04M 1/0268 |
| 2018/0081233 A1* | 3/2018 | Heo | G02F 1/133308 |
| 2018/0150112 A1* | 5/2018 | Aoki | G06F 1/1652 |
| 2018/0164852 A1* | 6/2018 | Lim | H04M 1/0214 |
| 2018/0234530 A1* | 8/2018 | Lee | H04M 1/02 |

FOREIGN PATENT DOCUMENTS

| | | |
|---|---|---|
| JP | 2014-103631 A | 6/2014 |
| JP | 2016-15618 A | 1/2016 |

\* cited by examiner

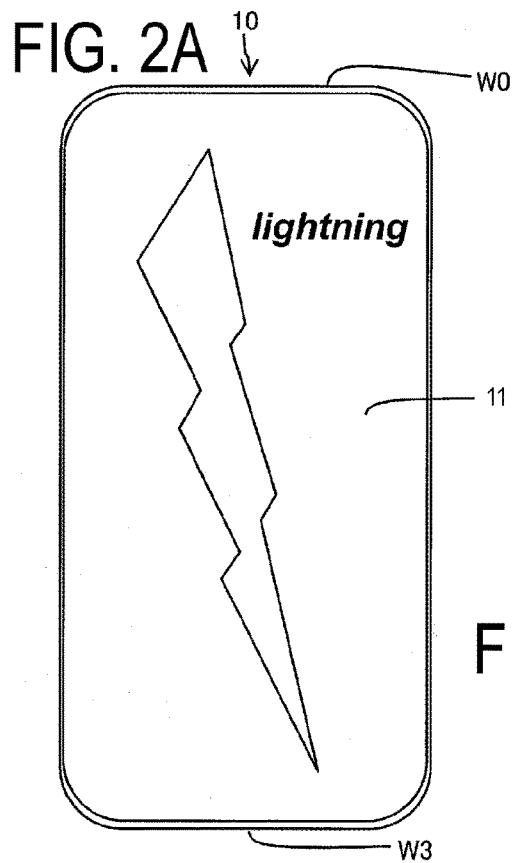
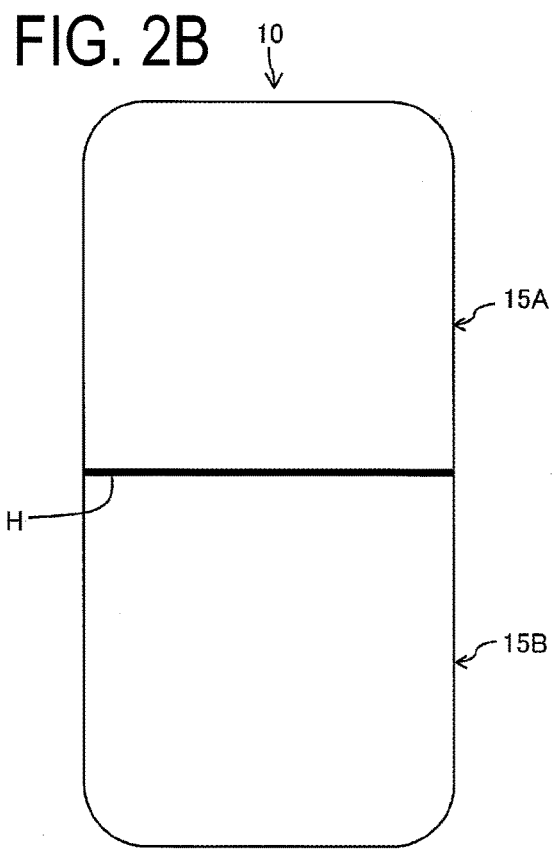

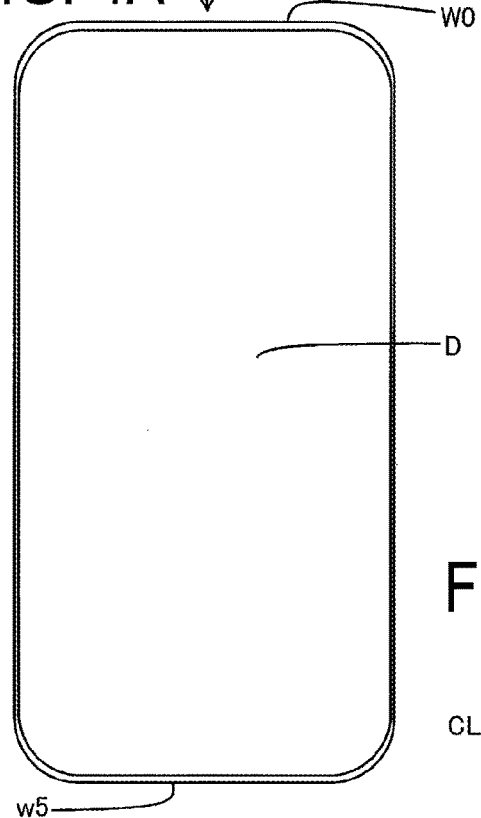
FIG. 4A
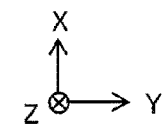
FIG. 4B
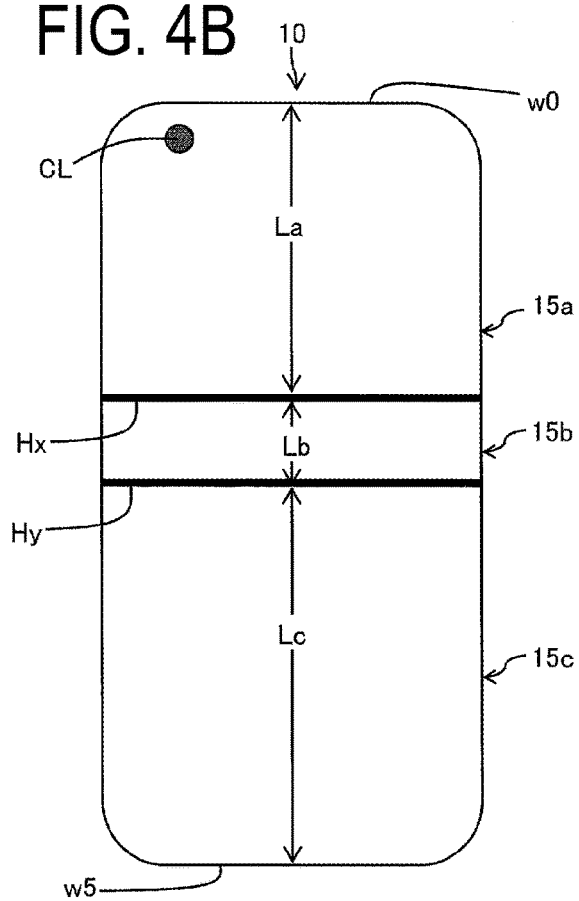

CLOSED MODE

PARTIAL SCREEN MODE

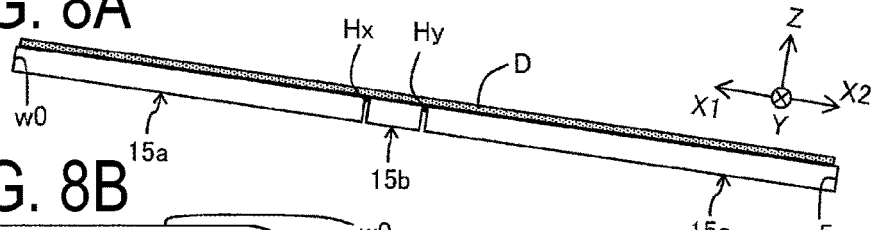
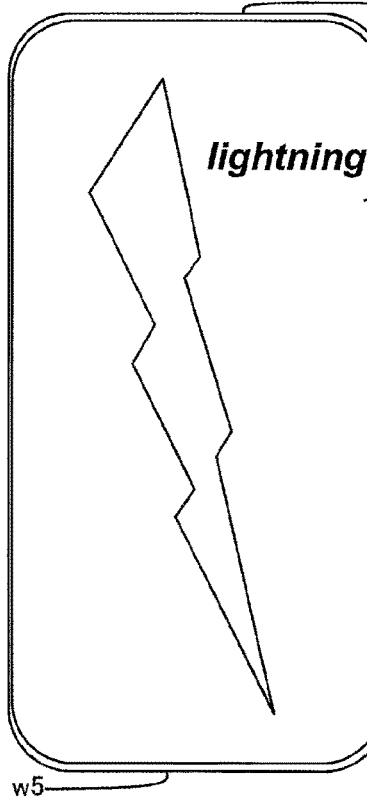
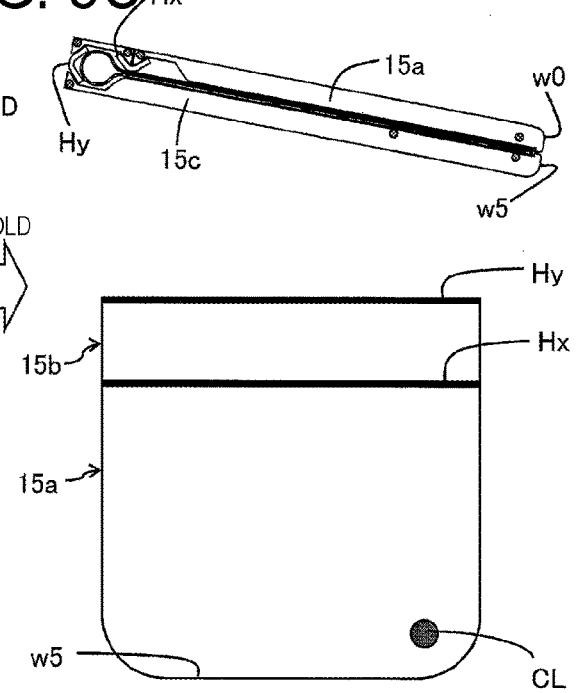
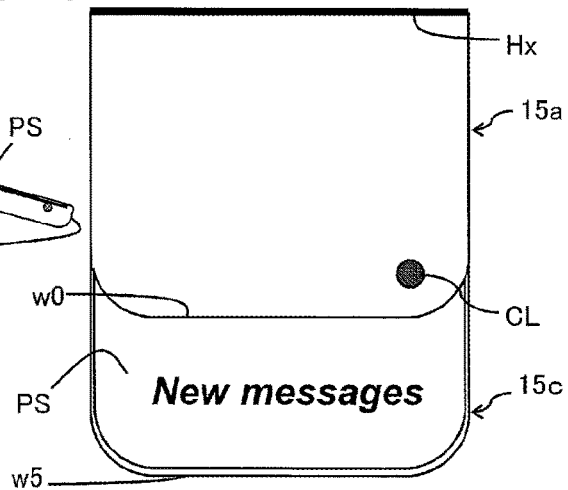

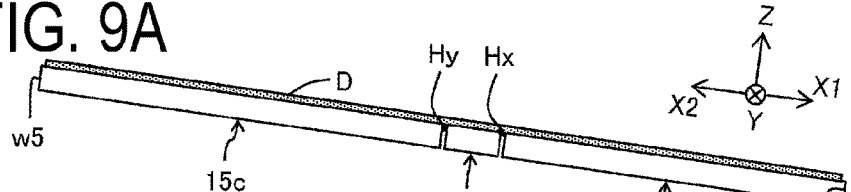
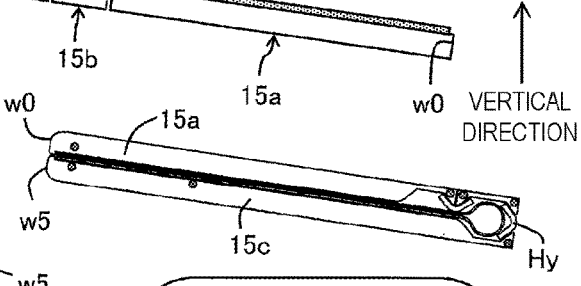
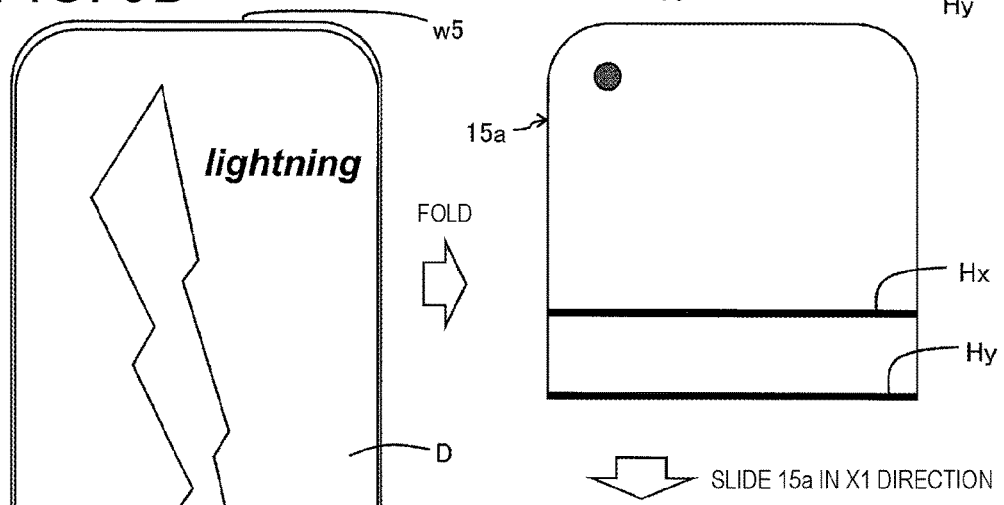
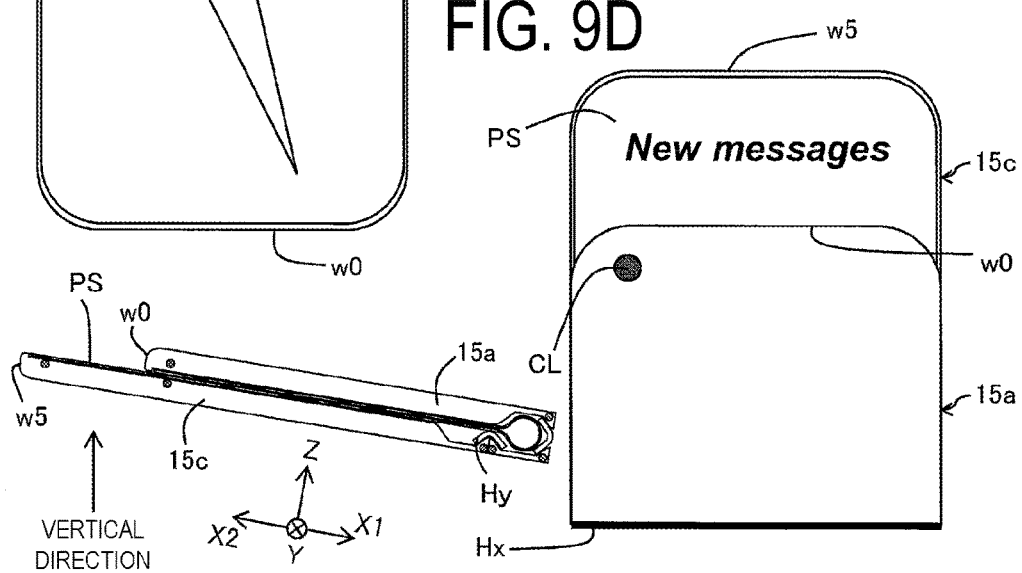

ELECTRONIC DEVICE

TECHNICAL FIELD

The disclosure relates to an electronic device having a display function.

BACKGROUND ART

PTL 1 discloses a display device that is foldable and provided with a display unit that is flexible and includes an organic electroluminescent (EL) element.

CITATION LIST

Patent Literature

PTL 1: JP 2016-15618 A (published Jan. 28, 2016)

SUMMARY

Technical Problem

The display device disclosed in PTL 1 requires, in a hinge section, a housing that includes a foldable portion as well as a member that restricts an angle of the foldable portion, resulting in the problem of a complex configuration.

Solution to Problem

An electronic device according to a first aspect of the disclosure includes a first housing, a second housing, a hinge that is flexible and connects the first housing and the second housing, and a display panel that is continuously flexible. The display panel includes a rear face that faces upper faces of the first housing and the second housing. The first housing includes a first magnetic body. The second housing includes a second magnetic body. When the hinge is in an open state, causing the first housing and the second housing to be disposed side-by-side in a first direction, a magnetic force in the first direction is produced between the first magnetic body and the second magnetic body.

Advantageous Effects of Disclosure

According to the present disclosure, it is possible to achieve a foldable screen using a simple configuration.

BRIEF DESCRIPTION OF DRAWINGS

FIG. 1A is a cross-sectional view in open mode, FIG. 1B is a cross-sectional view illustrating a transition process from open mode to closed mode, FIG. 1C is a cross-sectional view in closed mode, and FIG. 1D is a cross-sectional view illustrating a configuration of a display panel provided to the electronic device.

FIGS. 2A and 2B illustrate the configuration of the electronic device according to the first embodiment. FIG. 2A is a top view in open mode, and FIG. 2B is a bottom view (back view) in open mode.

FIG. 3A is a side view in full screen mode, and FIG. 3B is a cross-sectional view in full screen mode.

FIGS. 4A and 4B illustrate the configuration of the electronic device according to the second embodiment. FIG. 4A is a top view in full screen mode, and FIG. 4B is a bottom view (back view) in full screen mode.

FIG. 5A is a cross-sectional view in closed mode, FIG. 5B is a cross-sectional view illustrating a state of transition from closed mode to partial screen mode, and FIG. 5C is a cross-sectional view in partial screen mode.

FIG. 6A is a top view in closed mode, and FIG. 6B is a top view in partial screen mode.

FIGS. 8A to 8D illustrate usage of the electronic device according to the second embodiment in a forward direction. FIG. 8A is a side view, and FIG. 8B is a top view.

FIGS. 9A to 9D illustrate a method of use of the electronic device according to the second embodiment in a reverse direction. FIG. 9A is a side view, and FIGS. 9B to 9D are top views.

DESCRIPTION OF EMBODIMENTS

Embodiments of the disclosure will be described below with reference to FIGS. 1A to 12. These embodiments, however, are merely examples. Direction X (a length direction of an electronic device), direction Y (a width direction of the electronic device), and direction Z (a thickness direction of the electronic device) described below are relative to the electronic device serving as standard when the electronic device is in full screen mode, partial screen mode, or closed mode. For example, when the electronic device is tilted with respect to a horizontal plane, direction X is also tilted.

First Embodiment

Figure 1A:
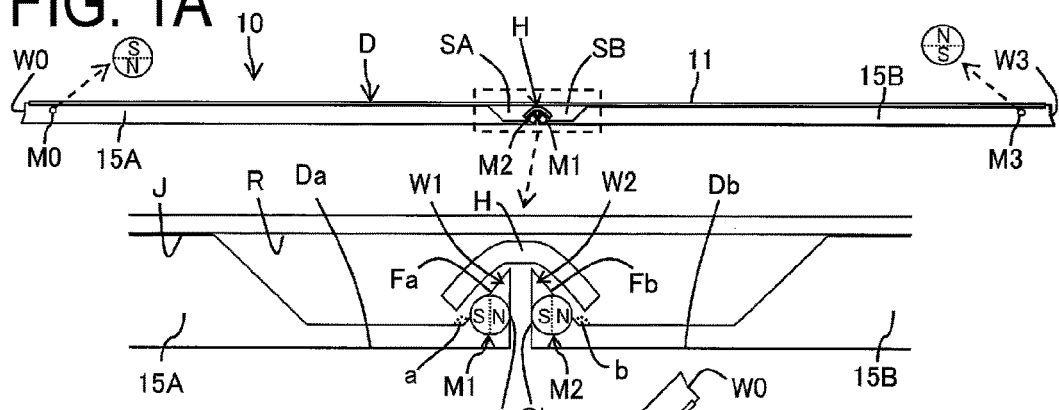
FIGS. 1A to 1D illustrate a configuration of an electronic device according to a first embodiment.
Figure 1B:
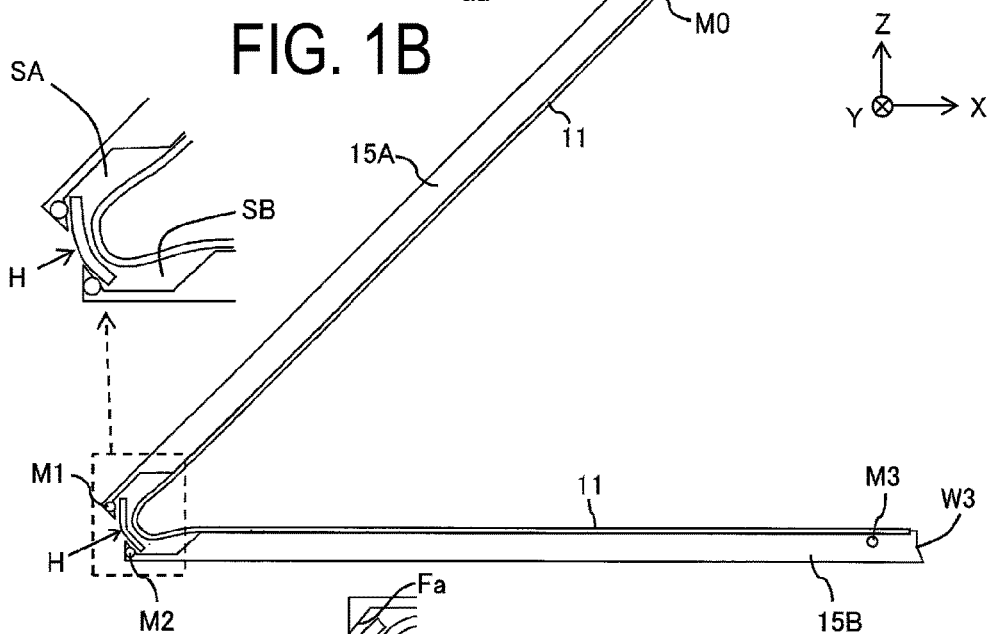
Figure 1C:
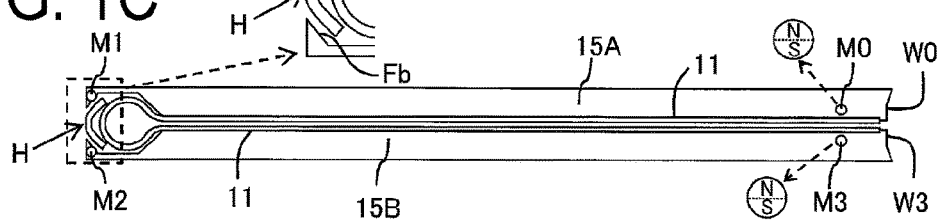
Figure 1D:
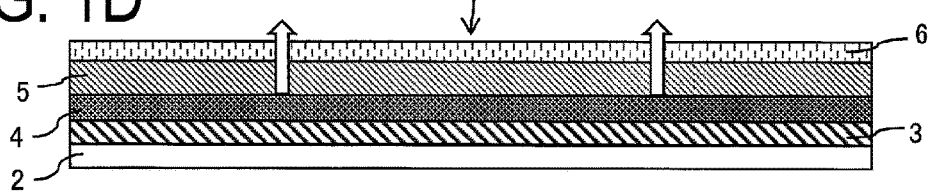

FIGS. 1A to 1D illustrate a configuration of an electronic device according to a first embodiment. FIG. 1A is a cross-sectional view in open mode, FIG. 1B is a cross-sectional view illustrating a transition process from open mode to closed mode, FIG. 1C is a cross-sectional view in closed mode, and FIG. 1D is a cross-sectional view illustrating a configuration of a display panel provided to the electronic device. FIGS. 2A and 2B illustrate the configuration of the electronic device according to the first embodiment. FIG. 2A is a top view in open mode, and FIG. 2B is a bottom view (back view) in open mode.

As illustrated in FIGS. 1A to 2B, an electronic device 10 according to the present embodiment is a high-performance mobile phone (a so-called smartphone), and includes a first housing and a second housing 15A, 15B, a hinge H that connects the first housing 15A and the second housing 15B, and a display panel 11 that is continuously flexible.

The hinge H is a flexible hinge made from a material having flexibility, and examples of such a material include a rubber, a silicon, and a fabric. Note that a metal or a resin with a plurality of through holes or depression patterns formed therein, or a material obtained by layering such a metal or a resin with a rubber or a silicon may be used.

Given a longitudinal direction of the electronic device 10 as direction X, a direction orthogonal to direction X as direction Y (width direction), and a direction orthogonal to direction X and direction Y as direction Z (height direction, normal direction of the display panel), the first housing 15A includes housing walls W0, W1 in direction Y and direction Z, the second housing 15B includes housing walls W2, W3 in direction Y and direction Z, and the housing walls W0, W3 serve as edges of the electronic device 10 in direction X (the longitudinal direction of the electronic device 10).

As illustrated in the enlarged view in FIG. 1A, an inner face of the housing wall W1 (first housing wall) includes an inclined face Fa that forms an obtuse angle a with a bottom face Da of the first housing 15A, and an inner face of the housing wall W2 (second housing wall) includes an inclined face Fb that forms an obtuse angle b with a bottom face Db of the second housing 15B. The hinge H is fixed by an adhesive or the like (not illustrated) to the inclined face Fa of the housing wall W1 and the inclined face Fb of the housing wall W2, the inclined faces Fa, Fb being adjacent to the hinge H, and extends across the housing wall W1 and the housing wall W2 when in an open state. Thus, a portion of the hinge H is positioned between the housing wall W1 and the display panel 11, and another portion of the hinge H is positioned between the housing wall W2 and the display panel 11. Note that an outer face of the housing wall W1 is a vertical plane Ga that forms a perpendicular angle with the bottom face Da of the first housing 15A, and an outer face of the second housing W2 is a vertical plane Gb that forms a perpendicular angle with the bottom face Db of the second housing 15B, and these vertical planes Ga, Gb are adjacent, facing each other.

As illustrated in FIGS. 1A to 1D, magnets M0 to M3 are provided correspondingly to the housing walls W0 to W3 of the first housing and the second housing 15A, 15B. The magnets M0 to M3 each have a spherical shape or a cylindrical shape that extends in direction Y. The magnet M0 is provided on the display panel side near the housing wall W0, the magnet M3 is provided on the display panel side near the housing wall W3, the magnet M1 (first magnetic body) is provided on the bottom face side of the housing wall W1, and the magnet M2 (second magnetic body) is provided on the bottom face side of the housing wall W2.

In the magnets M0, M3, magnetic poles are disposed side-by-side in direction Z with the display panel side of the magnet M0 being pole S and the display panel side of the magnet M3 being pole N. That is, the magnets M0, M3 are disposed so that, when the hinge H is in a closed state (FIG. 1C), different magnetic poles face each other in direction Z. Further, in the magnets M1, M2, the magnetic poles are disposed side-by-side in direction X with the housing wall W2 side of the magnet M1 being pole N, and the housing wall W1 side of the magnet M2 being pole S. That is, the magnets M1, M2 are disposed so that, when the hinge H is in an open state, different magnetic poles face each other in direction X.

The display panel 11 is provided so that a rear face R thereof (the face on the side opposite to a display face D) faces upper faces J of the first and the second housings 15A and 15B. Note that, to ensure a radius of curvature when the display panel is folded, a space SA is provided near the housing wall W1 of the first housing 15A, and a space SB is provided near the housing wall W2 of the second housing 15B.

The display panel 11 is a flexible organic light emitting diode (OLED) panel and, as illustrated in FIG. 1D, is provided with a thin film transistor (TFT) array layer 3, an OLED element layer 4, a sealing layer 5, and a function layer 6, in that order, on a flexible substrate 2. The TFT array layer 3 includes a TFT, a signal line, and a positive electrode, and the OLED element layer 4 includes an electrically active layer, a light emitting layer, and a negative electrode. A plurality of pixels are formed by the TFT array layer 3 and the OLED element layer 4. Further, the function layer 6 includes an optical film, a touch sensor sheet, and a protection film.

As illustrated in FIG. 1A, in the electronic device 10, when the hinge H is set to an open state, the mode changes to open mode where the first housing and the second housing 15A, 15B are disposed side-by-side in direction X, exposing the display face D. The display face side and the back face side in open mode are as illustrated in FIGS. 2A and 2B, respectively.

In open mode, as illustrated in FIG. 1A, the state of the first housing and the second housing 15A, 15B disposed side-by-side in direction X is maintained by a magnetic force in direction X produced between pole N of the first magnet M1 and pole S of the second magnet M2 facing each other.

As illustrated in FIGS. 1A to 1C, when the first housing 15A is rotated from open mode toward the second housing 15B with the hinge H serving as an axis, setting the hinge H to a closed state, the mode changes to closed mode (refer to FIG. 1C) where the first housing 15A and the second housing 15B overlap so that the housing wall W0 matches the housing wall W3 in relation to the position in direction X, and the display panel 11 is folded in two with the display face D stored on an inner side in its entirety (in the space between the first housing and the second housing 15A, 15B). In closed mode, the radius of curvature of a bending portion of the display panel 11 is ensured by the spaces SA, SB provided to the first housing and the second housing 15A, 15B.

Further, in closed mode, as illustrated in FIG. 1C, the state of the first housing 15A and the second housing 15B overlapping so that the housing wall W0 matches the housing wall W3 in relation to the position in direction X is maintained by the magnetic force in direction Z produced between pole S of the magnet M0 and pole N of the magnet M3 facing each other.

In the first embodiment, the housing wall W1 of the first housing 15A and the housing wall W2 of the second housing 15B are adjacent to each other, the flexible hinge H is fixed to the inner face sides (inclined faces Fa, Fb) of the housing walls W1, W2, and the open mode is maintained by the magnetic force in direction X that acts between the magnet M1 provided to the first housing W1 and the magnet M2 provided to the second housing W2.

Then, the first housing 15A is rotated to the second housing 15B side, bending the hinge H and causing the magnetic force in direction X between the magnets M1, M2 to weaken, and the closed mode to be maintained by the magnetic force in direction Z of the magnets M0, M3 that acts with the first housing and the second housing 15A, 15B overlapping. As a result, a foldable screen is achieved using a simple configuration.

In the first embodiment, the flexible hinge H is fixed to the inclined faces that serve as the inner faces of the housing walls W1, W2, making the hinge H operate smoothly and facilitating an open/close action.

Further, in closed mode, the radius of curvature of the bending portion of the display panel 11 is ensured by the spaces SA, SB provided to the first housing and the second housing 15A, 15B, making it possible to suppress the effects of the bending portion on the pixels.

Second Embodiment

Figure 3A:
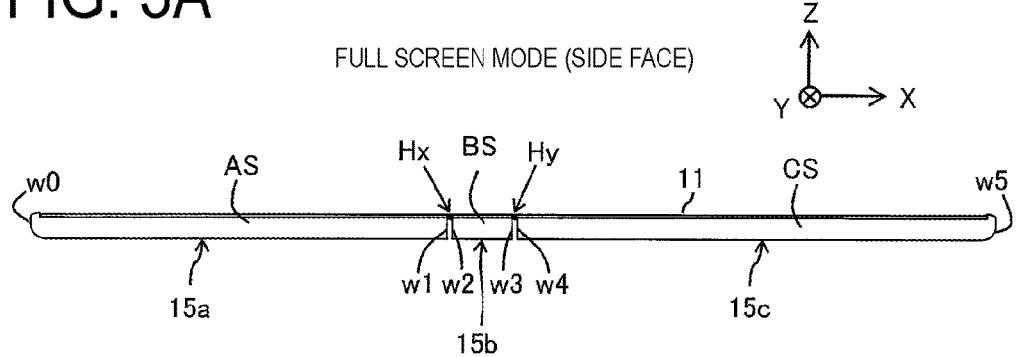
FIGS. 3A and 3B illustrate the configuration of the electronic device according to a second embodiment.
Figure 3B:
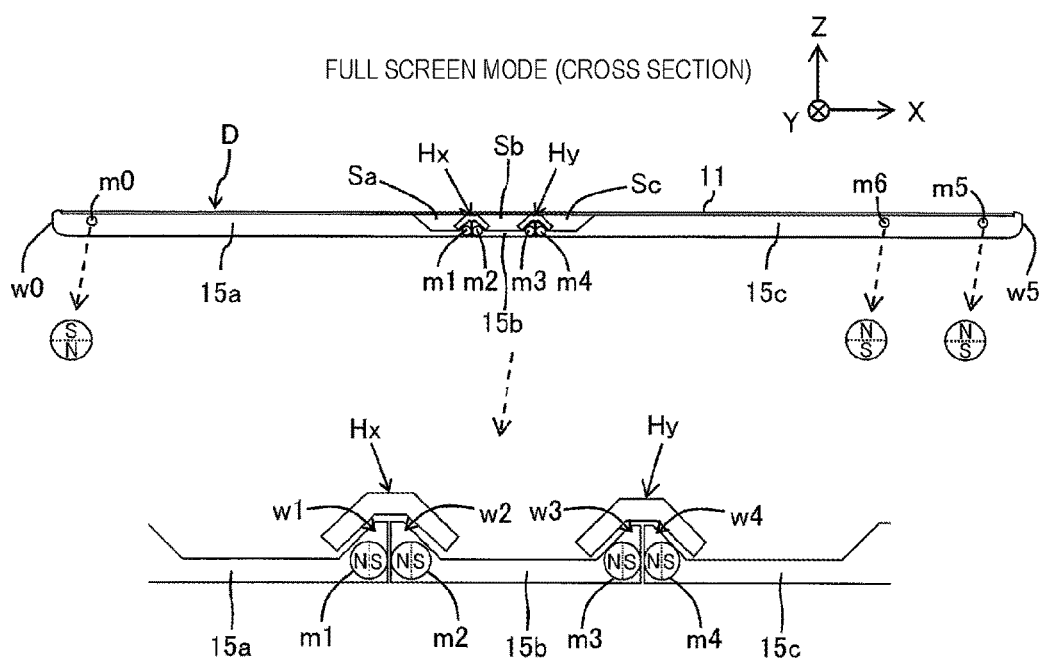

FIGS. 3A and 3B illustrate the configuration of the electronic device according to a second embodiment. FIG. 3A is a side view in full screen mode, and FIG. 3B is a cross-sectional view in full screen mode. FIGS. 4A and 4B illustrate the configuration of the electronic device according to the second embodiment. FIG. 4A is a top view in full screen mode, and FIG. 4B is a bottom view (back view) in full screen mode. Note that the cross-sectional view of the electronic device is a cross-sectional view from a plane parallel to direction Z that includes a center line (parallel to direction X) of the display face.

As illustrated in FIGS. 3A to 4B, the electronic device 10 according to the second embodiment includes first housings 15a to third housings 15c, a first hinge Hx that connects the first housing 15a and the second housing 15b, a second hinge Hy that connects the second housing 15b and the third housing 15c, and the display panel 11 that is continuously flexible (in FIG. 3A, gaps between the housings are largely drawn for convenience of explanation, but are actually substantially nonexistent). The first hinge and the second hinge Hx, Hy are both flexible hinges made from a material having flexibility.

Given a longitudinal direction of the electronic device 10 as direction X (depth direction), a direction perpendicular to direction X as direction Y (width direction), and a direction perpendicular to direction X and direction Y as direction Z (height direction), the first housing 15a includes a housing wall AS in direction X and direction Z, and housing walls w0, w1 in direction Y and direction Z; the second housing 15b includes a housing wall BS in direction X and direction Z, and housing walls w2, w3 in direction Y and direction Z; and the third housing 15c includes a housing wall CS in direction X and direction Z, and housing walls w4, w5 in direction Y and direction Z. The housing wall w0 is an edge on the first housing 15a side of the electronic device 10, and the housing wall w5 is an edge on the third housing 15c side of the electronic device 10.

The first hinge Hx is fixed to inner face sides of the housing walls w1, w2 (first housing wall and second housing wall) adjacent thereto, and the second hinge Hy is fixed to inner face sides of the housing walls w3, w4 (third housing wall and fourth housing wall) adjacent thereto. That is, a portion of the first hinge Hx is positioned between the housing wall w1 and the display panel 11, and another portion of the first hinge Hx is positioned between the housing wall w2 and the display panel 11. Further, a portion of the second hinge Hy is positioned between the housing wall w3 and the display panel 11, and another portion of the second hinge Hy is positioned between the housing wall w4 and the display panel 11.

The sizes (lengths) in direction X, as illustrated in FIG. 4B, are such that a length Lb of the second housing 15b<a length La of the first housing 15a<a length Lc of the third housing 15c. Specifically, the length Lc of the third housing 15c is equal (substantially equal) to the sum of the lengths of the first housing 15a and the second housing 15b. Note that the first housings 15a to the third housings 15c are equal in size in direction Y (width direction) and in direction Z (thickness).

The display panel 11 is provided so that a rear face thereof (the face on the side opposite to the display face D) faces upper faces of the first the first housings 15a to the third housings 15c. Note that, to ensure a radius of curvature when the display panel is folded, a space Sa is provided near the housing wall w1 of the first housing 15a, a space Sc is provided near a housing wall w4 of the third housing 15c, and an interior of the second housing 15b is established as a space Sb.

As illustrated in FIG. 3B, in the electronic device 10, when the first hinge and the second hinge Hx, Hy are each set to an open state, the mode changes to full screen mode where the first housings 15a to the third housings 15c are disposed side-by-side in direction X, exposing the display face D in its entirety. The display face side and the back face side in full screen mode are as illustrated in FIGS. 4A and 4B, respectively. As illustrated in FIG. 4B, a lens CL for image taking is provided on a bottom face of the third housing 15a (back face of the electronic device 10), near the housing wall w0.

Figure 5A:
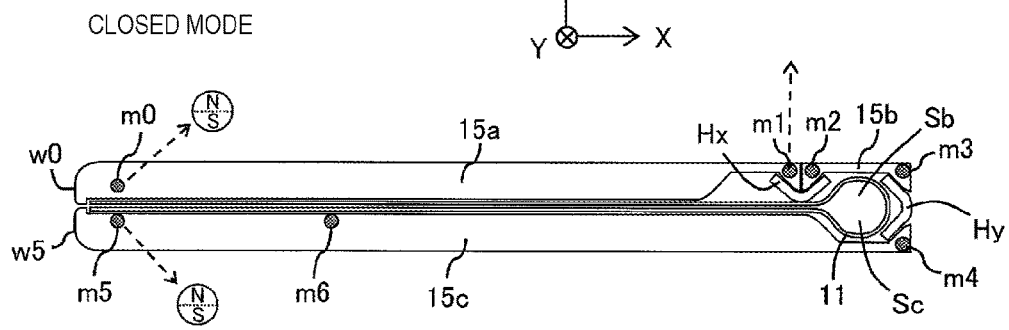
FIGS. 5A to 5C illustrate the configuration of the electronic device according to the second embodiment.
Figure 5B:
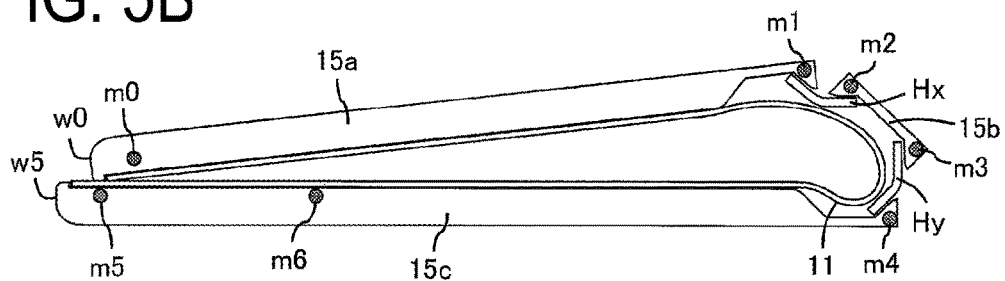
Figure 5C:
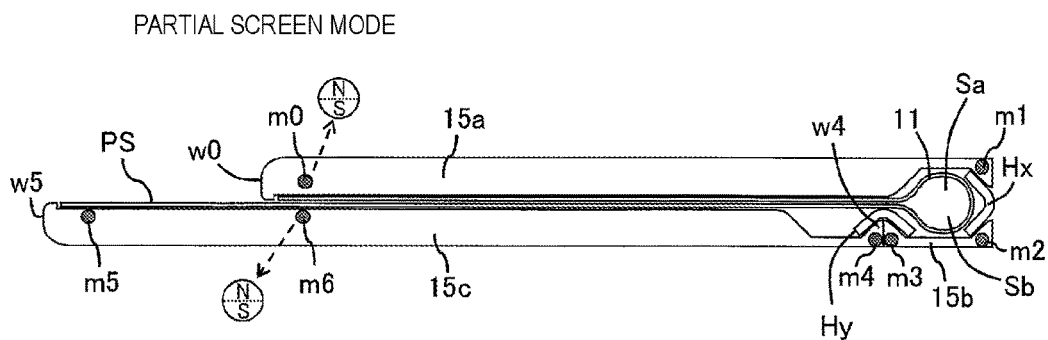
Figure 6A:
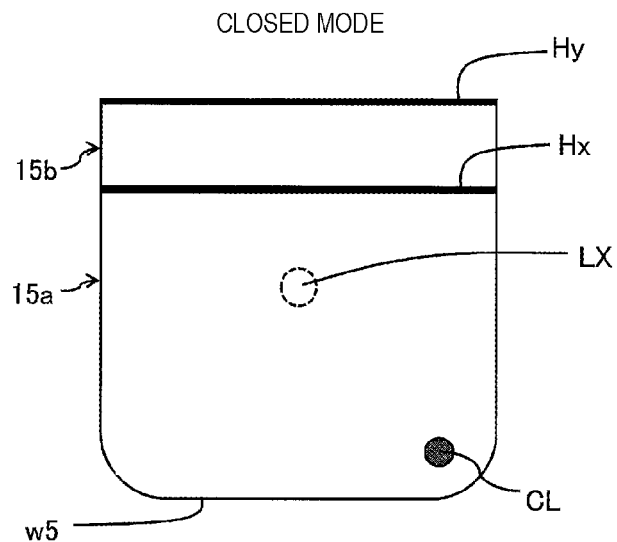
FIGS. 6A and 6B illustrate the configuration of the electronic device according to the second embodiment.
Figure 6B:
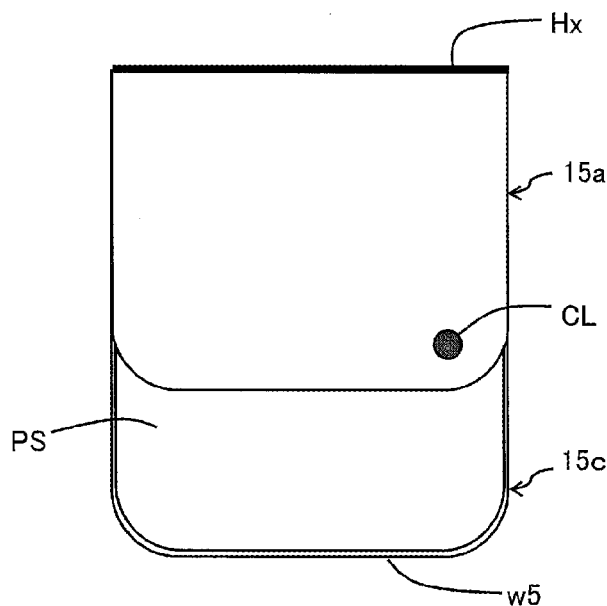

FIGS. 5A to 5C illustrate the configuration of the electronic device according to the second embodiment. FIG. 5A is a cross-sectional view in closed mode, FIG. 5B is a cross-sectional view illustrating a transition process from closed mode to partial screen mode, and FIG. 5C is a cross-sectional view in partial screen mode. FIGS. 6A and 6B illustrate the configuration of the electronic device according to the second embodiment. FIG. 6A is a top view in closed mode, and FIG. 6B is a top view in partial screen mode. Note that the cross-sectional view of the electronic device is a cross-sectional view from a plane parallel to direction Z that includes a center line (parallel to direction X) of the display face.

As illustrated in FIGS. 3A to 5A, when the first housing and the second housing 15a, 15b disposed side-by-side in direction X are rotated from full screen mode toward the third housing 15c with the second hinge Hy serving as an axis, setting the first hinge Hx to an open state and the second hinge Hy to a closed state, the mode changes to closed mode (refer to FIG. 6A) where the first housing and the second housing 15a, 15b and the third housing 15c overlap so that the housing wall w0 matches the housing wall w5 in relation to the position in direction X, and the display panel 11 is folded in two with the display face D stored on an inner side in its entirety (in the space between the first housing and second housing 15a, 15b, and the third housing 15c). In closed mode, the radius of curvature of the bending portion of the display panel 11 is ensured by the spaces Sb, Sc provided to the second and the third housings 15b, 15c. In this closed mode, as illustrated in FIG. 6A, one portion area LX of the bottom face of the first housing 15a emits light, thereby notifying the user of incoming calls and the like. Note that the color or pattern of the emitted light is varied according to the type of incoming call.

As illustrated in FIGS. 5B and 5C, when the first housing 15a is slid in direction X (rightward in the figure) from closed mode, setting the first hinge Hx to a closed state and the second hinge Hy to an open state, the mode changes to partial screen mode where the second and the third housings 15b, 15c disposed side-by-side in direction X and the first housing 15a overlap so that the housing wall w0 is between the housing walls w4, w5 in relation to the position in direction X, exposing a partial screen PS, which is a portion of the display face (refer to FIG. 6B). Note that the partial screen PS overlaps with a portion close to the housing wall w5 of the third housing 15c. In partial screen mode, the radius of curvature of the bending portion of the display panel 11 is ensured by the spaces Sa, Sb provided to the first and the second housings 15a, 15b, as illustrated in FIG. 5C.

Figure 7:
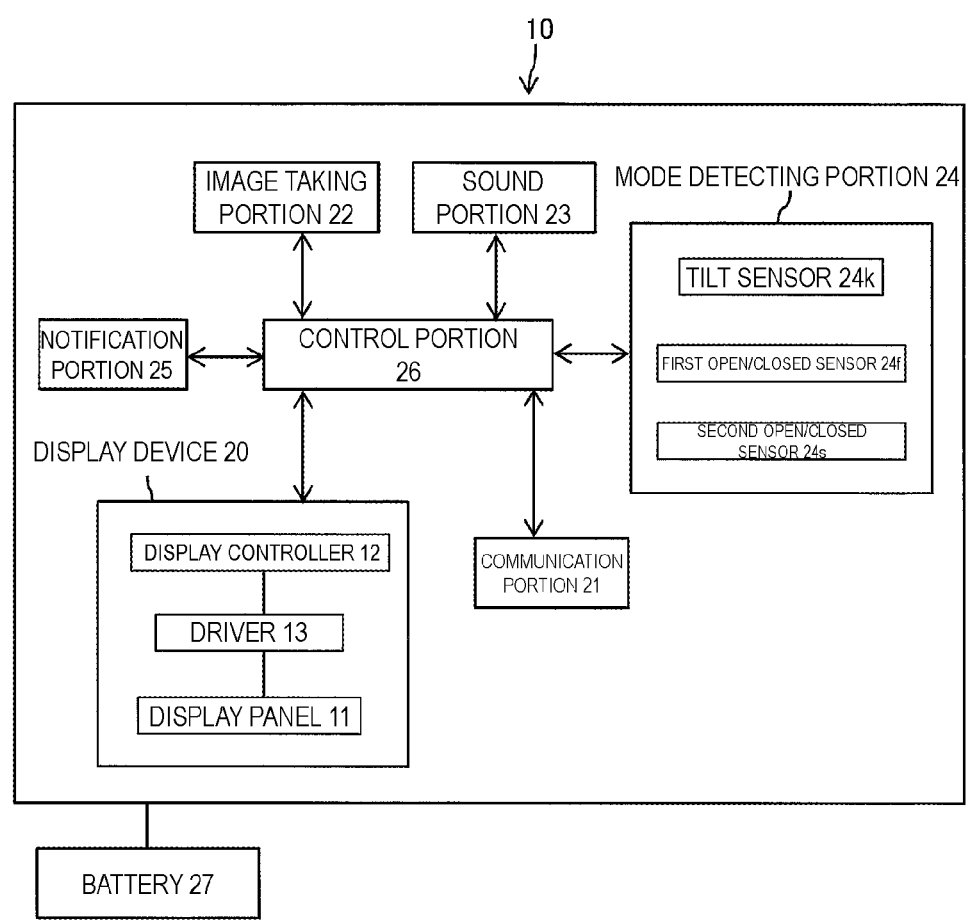
FIG. 7 is a block diagram illustrating the configuration of the electronic device according to the second embodiment.

FIG. 7 is a block diagram illustrating the configuration of the electronic device according to the second embodiment. As illustrated in FIG. 7, the electronic device 10 includes a display device 20, a communication portion 21, an image taking portion 22, a sound portion 23, a mode detecting portion 24, a notification portion 25, a control portion 26, and a battery 27.

The display device 20 includes the display panel 11, a driver 13 that drives the display panel 11, and a display controller 12 that controls the driver 13 and displays images. The communication portion 21 includes a transceiver circuit, and sends and receives various data.

The image taking portion 22 includes a lens and an image sensor, and records images. The sound portion 23 includes a speaker and an audio sensor, and outputs and records sounds. The mode detecting portion 24 includes a tilt sensor 24k that detects a tilt of the electronic device 10, a first open/closed sensor 24f that detects the open/closed state of the first hinge Hx in FIGS. 3A and 3B, and a second open/closed sensor 24s that detects the open/closed state of the second hinge Hy in FIGS. 3A and 3B, and detects a mode (state) of the electronic device 10. The notification portion 25 includes a light emitting element such as an LED, and notifies (indicates) information to the user in closed mode by an emitted color, blinking pattern, and the like.

The control portion 26 includes a processor and a memory, and controls these by exchanging signals and data between the display device 20 and each of the portions 21 to 25. The battery 27 supplies power to the display device 20 and each of the portions 21 to 26 in the electronic device. Note that the display device 20, each of the portions 21 to 26, and the battery 27 may be configured so that at least a portion of the components are stored in the first housings 15a to the third housings 15c in FIGS. 3A and 3B.

As illustrated in FIGS. 3A to 5C, magnets m0 to m5 are provided correspondingly to the housing walls w0 to w5 of the first to the third housings 15a to 15c. That is, the magnet m0 is provided to the display panel side near the housing wall w0, the magnet m5 is provided to the display panel side near the housing wall w5, the magnet m1 (first magnetic body) is provided to the bottom face side of the housing wall w1, the magnet m2 (second magnetic body) is provided to the bottom face side of the housing wall w2, the magnet m3 (third magnetic body) is provided to the bottom face side of the housing wall w3, and the magnet m5 (fourth magnetic body) is provided to the bottom face side of the housing wall w4. Further, a magnet m6 is provided to the third housing 15c in a position separated by a certain distance (a value corresponding to the size of the portion PS of the display face in direction X) from the position of the magnet m5 in direction X.

In the magnets m0, m5, m6, magnetic poles are disposed side-by-side in direction Z with the display panel side of the magnet m0 being pole S and the display panel sides of the magnets m5, m6 being pole N. Further, in the magnets m1 to m4, the magnetic poles are disposed side-by-side in direction X with, for example, the housing wall w2 side of the magnet m1 being pole S, the housing wall w1 side of the magnet m2 being pole N, the housing wall w4 side of the magnet m3 being pole S, and the housing wall w3 side of the magnet m4 being pole N.

For example, in full screen mode, as illustrated in FIG. 3B, the state of the first to the third housings 15a to 15c disposed side-by-side in direction X is maintained by a magnetic force in direction X produced between the magnets m1, m2 and a magnetic force in direction X produced between the magnets m3, m4.

Further, in closed mode, as illustrated in FIG. 5A, the state of the first housing and the second housing 15a, 15b, disposed side-by-side in direction X overlapping with the third housing 15c so that the housing wall w0 matches the housing wall w5 in relation to the position in direction X is maintained by the magnetic force of the magnets m1, m2 in direction X and a magnetic force in direction Z produced between the magnets m0, m5.

Further, in partial screen mode, as illustrated in FIG. 5C, the state of the first housing and the second housing 15a, 15b disposed side-by-side in direction X overlapping with the third housing 15c so that the housing wall w0 is between the housing walls w4, w5 in relation to the position in direction X is maintained by the magnetic force in direction X produced between the magnets m3, m4 and a magnetic force in direction Z produced between the magnets m0, m6.

The first open/closed sensor 24f in FIG. 7 is a photosensor that includes a light emitting element and a light receiving element, and detects the open/closed state of the first hinge Hx with the light emitting element provided to one of the housing walls w1, w2 and the light receiving element provided to the other. That is, the first open/closed sensor 24f transmits to the control portion 26 an ON signal indicating that the housing walls w1, w2 are close to each other as in FIG. 3B, causing the control portion 26 to determine that the first hinge Hx is in an open state, and transmits to the control portion 26 an OFF signal indicating that the housing walls w1, w2 are separated as in FIG. 5C, causing the control portion 26 to determine that the first hinge Hx is in a closed state.

Similarly, the second open/closed sensor 24s in FIG. 7 is a photosensor that includes a light emitting element and a light receiving element, and detects the open/closed state of the second hinge Hy with the light emitting element provided to one of the housing walls w3, w4 and the light receiving element provided to the other. That is, the second open/closed sensor 24s transmits to the control portion 26 an ON signal indicating that the housing walls w3, w4 are close to each other as in FIG. 3B, causing the control portion 26 to determine that the second hinge Hy is in an open state, and transmits an OFF signal to the control portion 26 indicating that the housing walls w3, w4 are separated as in FIG. 5A, causing the control portion 26 to determine that the second hinge Hy is in a closed state.

The first and the second open/closed sensors 24f, 24s may be magnetic sensors. In this case, for example, the first open/closed sensor 24f provided to the first hinge Hx transmits to the control portion 26 an ON signal indicating the magnetic state in FIG. 3B, causing the control portion 26 to determine that the first hinge Hx is in an open state, and transmits to the control portion 26 an OFF signal indicating the magnetic state in FIG. 5C, causing the control portion 26 to determine that the first hinge Hx is in a closed state. Further, for example, the second open/closed sensor 24s provided to the second hinge Hy transmits to the control portion 26 an ON signal indicating the magnetic state in FIG. 3B, causing the control portion 26 to determine that the second hinge Hy is in an open state, and transmits to the control portion 26 an OFF signal indicating the magnetic state in FIG. 5A, causing the control portion 26 to determine that the second hinge Hy is in a closed state.

The tilt sensor 24*k* in FIG. 7 outputs a forward direction signal to the control portion 26 when the electronic device 10 is in a horizontal state or a state where the housing wall w5, serving as an edge on the third housing 15*c* side, is on the vertically downward side, and outputs a reverse direction signal when the electronic device 10 is in a state where the housing wall w5, serving as an edge on the third housing 15*c* side, is on the vertically upward side.

FIGS. 8A to 8D illustrate the electronic device during use in the forward direction. FIG. 8A is a side view, FIGS. 8B to 8D are top views, FIG. 8C is a cross-sectional view and a top view, and FIG. 8D is a cross-sectional view and a top view.

In full screen mode where the electronic device 10 is in a state where the housing wall w5 is set as the vertically downward side as in FIG. 8A, the tilt sensor 24*k* transmits the forward direction signal to the control portion 26, causing the control portion 26 to determine that the electronic device is in the forward direction and display the full screen with the housing wall w5 side set as the lower side with respect to the display device 20 (refer to FIG. 8B).

From the full screen mode in FIG. 8A, the user can set the mode to closed mode in FIG. 8C by rotating the first housing 15*a* and the second housing 15*b* with the second hinge Hy serving as the axis. Furthermore, from the closed mode in FIG. 8C, the user can set the mode to the partial screen mode in FIG. 8D and check the partial screen PS (disposed between the housing wall w0 and the housing wall w5 in a top view) exposed on the device lower side by sliding (obliquely upward) the first housing 15*a* in direction X1 (from the housing wall w5 toward the second hinge Hy). In partial screen mode where the electronic device 10 is set in a state where the housing wall w5 is set as the vertically downward side as in FIG. 8D, the control portion 26 receives the forward direction signal from the tilt sensor 24*k* and displays a partial screen (displays the partial screen PS only) with the housing wall w5 side set as the lower side with respect to the display device 20.

FIGS. 9A to 9D illustrate the electronic device during use in direction. FIG. 9A is a side view, FIGS. 9B to 9D are top views, FIG. 9C is a cross-sectional view and a top view, and FIG. 9D is a cross-sectional view and a top view.

In full screen mode where the electronic device 10 is set in a state where the housing wall w5 is set as the vertically upward side as in FIG. 9A, the tilt sensor 24*k* transmits the reverse direction signal to the control portion 26, causing the control portion 26 to determine that the electronic device is in the reverse direction and display the full screen with the housing wall w5 side set as the upper side with respect to the display device 20 (refer to FIG. 9B).

From the full screen mode in FIG. 9A, the user can set the mode to closed mode in FIG. 9C by rotating the first housing 15*a* and the second housing 15*b* with the second hinge Hy serving as the axis. Furthermore, from the closed mode in FIG. 9C, the user can set the mode to the partial screen mode in FIG. 9D and check the partial screen PS (disposed between the housing wall w0 and the housing wall w5 in a top view) exposed on the device upper side by sliding (obliquely downward) the first housing 15*a* in direction X1 (from the housing wall w5 toward the second hinge Hy). In partial screen mode where the electronic device 10 is set in a state where the housing wall w5 is set as the vertically upward side as in FIG. 9D, the control portion 26 receives the reverse direction signal from the tilt sensor 24*k* and displays a partial screen (displays the partial screen PS only) with the housing wall w5 side set as the upper side with respect to the display device 20.

Figure 10A:
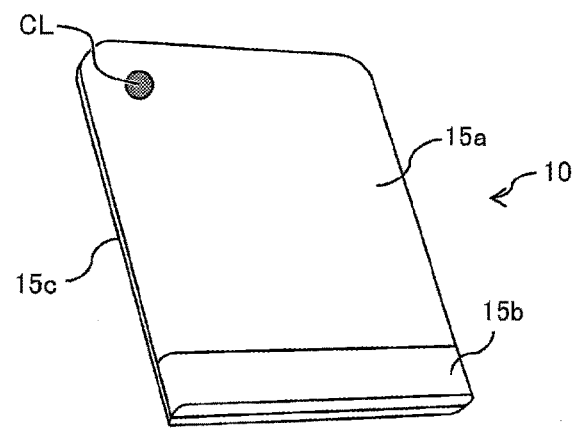
FIGS. 10A to 10C are perspective views illustrating a method of use of the electronic device according to the second embodiment in the reverse direction.
Figure 10D:
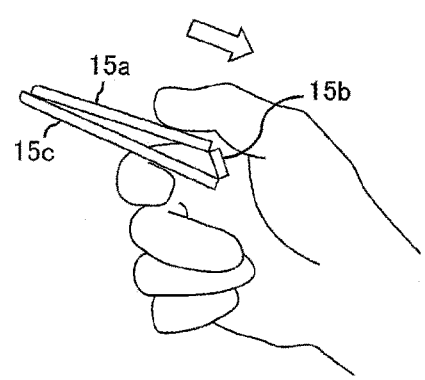
FIG. 10D is a schematic view illustrating a transition process from the closed mode illustrated in FIG. 10A to the partial screen mode illustrated in FIG. 10C.
Figure 10B:
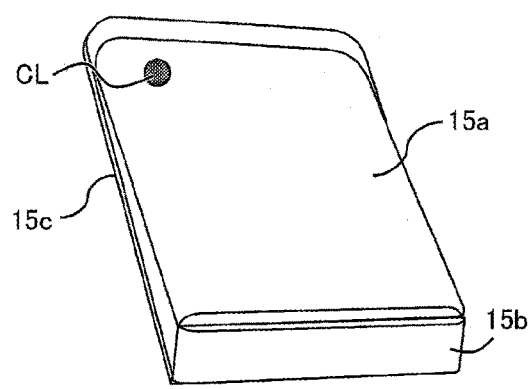
Figure 10C:
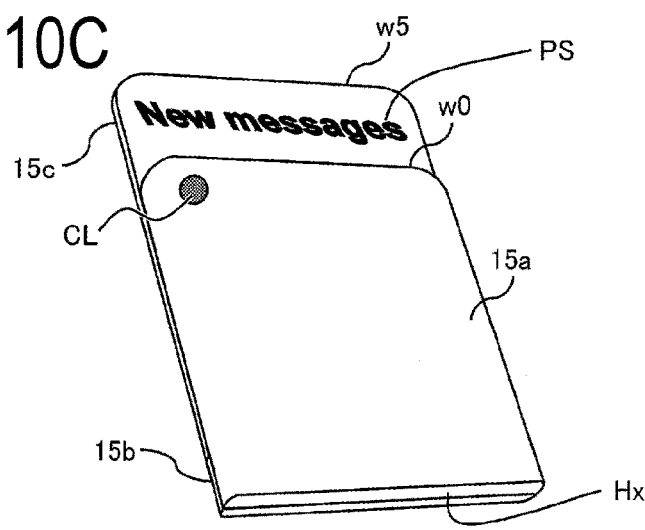

Here, FIGS. 10A to 10C illustrate a perspective view of a method of use of the electronic device in the reverse direction and FIG. 10D illustrates a transition (slide) process from the closed mode illustrated in FIG. 10A to the partial screen mode illustrated in FIG. 10C.

Figure 11:
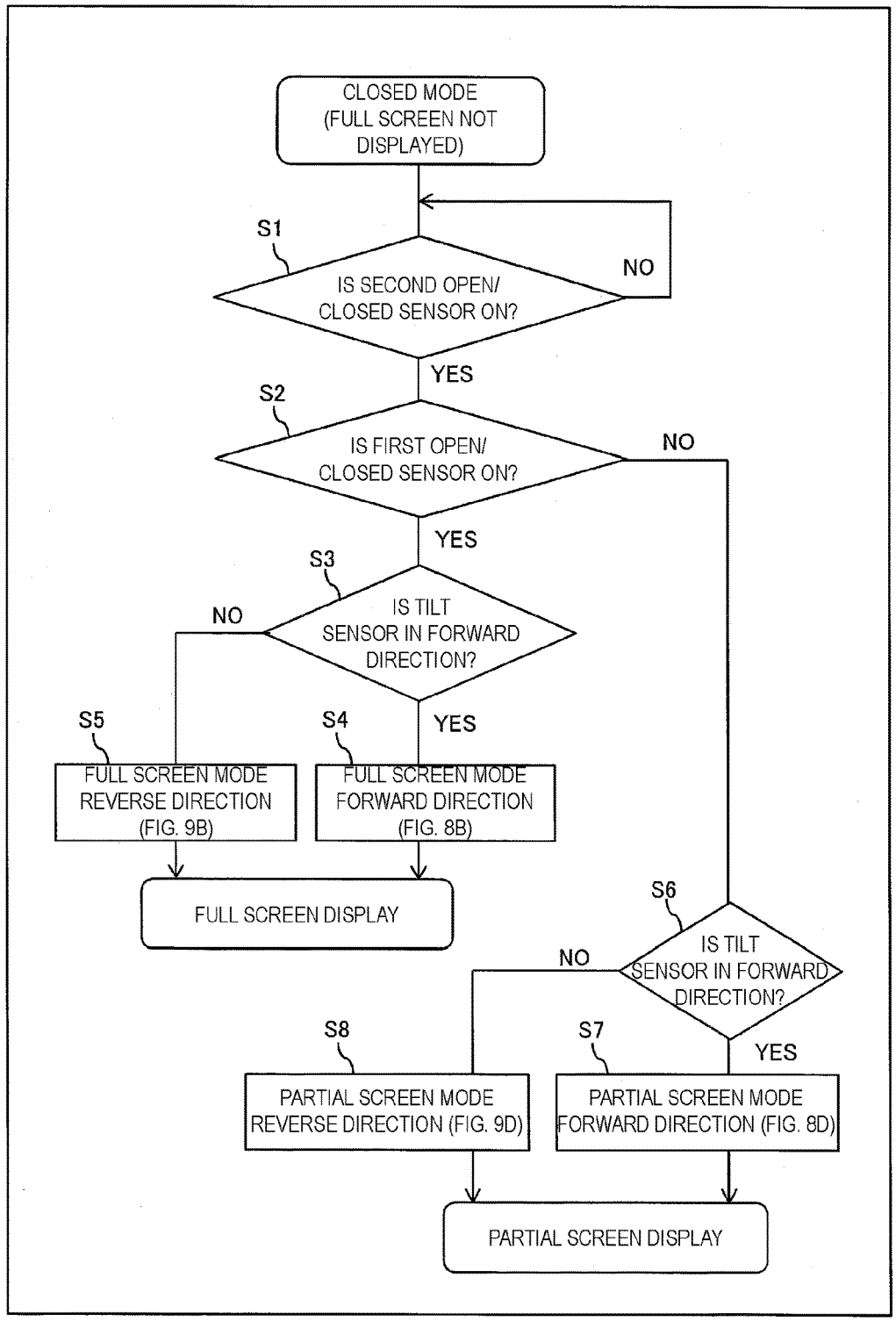
FIG. 11 is a flowchart illustrating a mode setup procedure of the electronic device according to the second embodiment.

FIG. 11 is a flowchart illustrating a mode setup procedure of the electronic device. First, when the electronic device 10 is set to closed mode (sleep mode), the control portion 26 causes the display panel 11 to be hidden in its entirety. In closed mode, as illustrated in FIG. 6A, the one portion area LX of the bottom face of the first housing 15*a* emits light, notifying the user accordingly.

The control portion 26 determines whether the second open/closed sensor 24*s* is outputting an ON signal in step S1 and, in a case where it is YES in step S1, determines whether the first open/closed sensor 24*f* is outputting an ON signal in step S2. In a case where it is YES in step S2, the control portion 26 determines whether the output of the tilt sensor 24*k* is a forward direction signal (the electronic device 10 is in a horizontal state or a state where the housing wall w5 serving as an edge on the third housing 15*c* side is set as the vertically downward side) in step S3, and starts in full screen mode in the forward direction in FIG. 8B in a case where it is YES in step S3, or starts in full screen mode in the reverse direction in FIG. 9B in a case where it is NO (the electronic device 10 is in a state where the housing wall w5 is set as the vertically upward side) in step S3. As a result, the electronic device 10 is set to full screen mode and the full screen is displayed on the display panel 11 (the pixels corresponding to the full screen are driven).

On the other hand, in a case where NO in step S2, the control portion 26 determines whether the output of the tilt sensor 24*k* is a forward direction signal (the electronic device 10 is in a horizontal state or a state where the housing wall w5 serving as an edge on the third housing 15*c* side is set as the vertically downward side) in step S6, and starts in partial screen mode in the forward direction in FIG. 8D in a case where it is YES in step S6, or starts in partial screen mode in the reverse direction in FIG. 9D in a case where it is NO (the electronic device 10 is in a state where the housing wall w5 is set as the vertically upward side) in step S6. As a result, the electronic device 10 is set to partial screen mode and the display panel 11 is partially displayed (only the pixels corresponding to the partial screen PS are driven).

While FIG. 11 describes when startup is performed in full screen mode or partial screen mode from closed mode, the setting is switched to partial screen mode when the first open/closed sensor 24*f* outputs an OFF signal after the mode is set to full screen mode, and to closed mode when the second open/closed sensor 24*s* outputs an OFF signal after the mode is set to full screen mode.

Further, the setting is switched to full screen mode when the first open/closed sensor 24*f* outputs an ON signal after the mode is set to partial screen mode, and to closed mode when the second open/closed sensor 24*s* outputs an OFF signal after the mode is set to partial screen mode.

Note that the contents of each step in FIG. 11 are realized by, for example, the processor of the control portion 26 executing a program stored in memory.

With the partial screen mode (refer to FIGS. 8D and 9D) made available as described above, when checking a portion of the display face (the partial screen PS) is sufficient, that is, when the information required by the user can be displayed on the partial screen PS, the user does not have to open the display face in its entirety, resulting in enhanced convenience for the user.

In the second embodiment, as illustrated in FIGS. 3A and 3B, the housing wall w1 of the first housing 15a and the housing wall w2 of the second housing 15b are adjacent to each other, the housing wall w3 of the second housing 15b and the housing wall w4 of the third housing 15c are adjacent to each other, the flexible first hinge Hx is fixed to the inner face sides (inclined faces) of the housing walls w3, w4, and the full screen mode is maintained by the magnetic force in direction X that acts between the magnet m1 provided to the housing wall w1 and the magnet m2 provided to the housing wall w2, and the magnetic force in direction X that acts between the magnet m3 provided to the housing wall w3 and the magnet 4 provided to the housing wall w4. Further, as illustrated in FIG. 5A, closed mode is maintained by the magnetic force in direction X that acts between the magnet m1 provided to the housing wall w1 and the magnet m2 provided to the housing wall w2, and the magnetic force in direction Z of the magnets m0, m5 that acts with the first housing and the third housing 15a, 15c overlapping. Then, as illustrated in FIG. 5C, partial screen mode is maintained by the magnetic force in direction X that acts between the magnet m3 provided to the housing wall w3 and the magnet m4 provided to the housing wall w4, and the magnetic force in direction Z of the magnets m0, m6 that acts with the first housing and the third housing 15a, 15c overlapping. Thus, in the second embodiment, three modes can be achieved with a simple configuration.

In the second embodiment, as illustrated in FIGS. 3A to 5C, the flexible first hinge Hx is fixed to the inclined faces serving as the inner face sides of the housing walls w1, w2, and the flexible second hinge Hy is fixed to the inclined faces serving as the inner face sides of the housing walls w3, w4, making it possible to switch modes by a smooth slide operation such as illustrated in FIGS. 10A to 10D.

Figure 12:
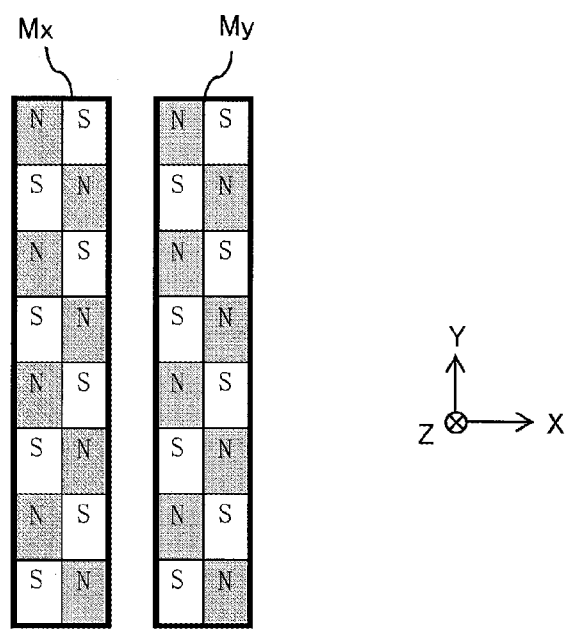
FIG. 12 is a schematic view illustrating an example of a magnetic pole arrangement of magnets according to the first and second embodiments.

In the first embodiment, the magnet M1 (first magnetic body) and the magnet M2 (second magnetic body) may be configured as magnets Mx, My in FIG. 12. The magnets Mx, My are each configured with single magnets, having magnetic poles (N/S) disposed side-by-side in direction X, disposed side-by-side in direction Y while alternating the magnetic poles, and the magnet Mx and the magnet My are adjacent to each other so that different magnetic poles face each other in direction X.

The magnet m1 (first magnetic body) and the magnet m2 (second magnetic body) of the second embodiment may be configured as the magnets Mx, My in FIG. 12, or the magnet m3 (third magnetic body) and the magnet m4 (fourth magnetic body) of the second embodiment may be configured as the magnets Mx, My in FIG. 12.

Further, while the magnetic forces act in direction X and direction Z using two magnets according to the first and second embodiments, the present disclosure is not limited thereto. As long as the required magnetic forces are produced, a magnetic body that is not a magnet (iron, nickel, etc.) may be used as one of the two magnets.

Supplement

An electronic device according to a first aspect includes a first housing, a second housing, a hinge that is flexible and connects the first housing and the second housing, and a display panel that is continuously flexible. The display panel includes a rear face that faces upper faces of the first housing and the second housing. The first housing includes a first magnetic body. The second housing includes a second magnetic body. When the hinge is in an open state, causing the first housing and the second housing to be disposed side-by-side in a first direction, a magnetic force in the first direction is produced between the first magnetic body and the second magnetic body.

According to a second aspect, the first housing further includes a first housing wall, the second housing further includes a second housing wall, the first housing wall and the second housing wall are adjacent to each other, and the hinge extends across the first housing wall and the second housing wall when in the open state.

According to a third aspect, the hinge H includes a portion thereof positioned between the first housing wall and the display panel, and another portion thereof positioned between the second housing wall and the display panel.

According to a fourth aspect, the first magnetic body is provided to the first housing wall, and the second magnetic body is provided to the second housing wall.

According to a fifth aspect, the first housing wall includes on an inner face thereof an inclined face that forms an obtuse angle with a bottom face of the first housing, the second housing wall includes on an inner face thereof an inclined face that forms an obtuse angle with a bottom face of the second housing, and the hinge overlaps with the inclined faces of the first and the second housing walls.

According to a sixth aspect, the first magnetic body and the second magnetic body are magnets and are disposed so that, when the hinge is in an open state, different magnetic poles face each other in the first direction.

According to a seventh aspect, the first housing and the second housing each include a space for storing a bending portion of the display panel in an interior thereof when the hinge is in a closed state.

According to an eighth aspect, the electronic device further includes a magnetic sensor that detects an open/closed state of the hinge on the basis of a change in a magnetic state caused by changes in position of the first magnetic body and the second magnetic body.

According to a ninth aspect, when the hinge is in a closed state, a magnetic force is produced in a normal direction of the display panel between a magnetic body other than the first magnetic body provided to the first housing, and a magnetic body other than the second magnetic body provided to the second housing.

According to a tenth aspect, the electronic device further includes a third housing, and a second hinge that is flexible and connects the second housing and the third housing. The hinge that connects the first housing and the second housing serves as a first hinge, the rear face of the display panel faces the third housing, the second housing further includes a third magnetic body, the third housing includes a fourth magnetic body. When the second hinge is in an open state, causing the second housing and the third housing to be disposed side-by-side in the first direction, a magnetic force in the first direction is produced between the third magnetic body and the fourth magnetic body.

According to an eleventh aspect, the first to the third housings are disposed side-by-side in a first direction, exposing a display face in its entirety, when the first hinge and the second hinge are set to open states. The third housing is larger in size in the first direction than the first housing and the second housing, exposing a portion of the display face when the first hinge and the second hinge are set to a closed state and an open state, respectively.

According to a twelfth aspect, when the first hinge is in a closed state and the second hinge is in an open state, a magnetic force is produced in a normal direction of the display panel between a magnetic body other than the first magnetic body provided to the first housing, and a magnetic body other than the fourth magnetic body provided to the third housing.

According to a thirteenth aspect, the display face is stored in its entirety by setting the first hinge to an open state and the second hinge to a closed state.

According to a fourteenth aspect, from the state where the display face is stored in its entirety, a portion of the display face is exposed by sliding the first housing in the first direction.

According to a fifteenth aspect, the display panel includes an OLED panel.

According to a sixteenth aspect, the electronic device further includes a communication function.

The disclosure is not limited to each of the embodiments stated above, and embodiments obtained by appropriately combining technical approaches stated in each of the different embodiments also fall within the scope of the technology of the present disclosure. Moreover, novel technical features may be formed by combining the technical approaches stated in each of the embodiments.

REFERENCE SIGNS LIST

10 Electronic device
11 Display panel
15A, 15B First and second housing
15a to 15c First housing to third housing
CL lens
PS Partial screen
H Hinge
Hx First hinge
Hy Second hinge
W0 to W3 Housing wall
w0 to w5 Housing wall
M0 to M3 Magnet
m0 to m5 Magnet

The invention claimed is:

1. An electronic device comprising:
a first housing;
a second housing;
a hinge that is flexible and connects the first housing and the second housing; and
a display panel that is continuously flexible, wherein
the display panel includes a rear face that faces upper faces of the first housing and the second housing,
the first housing includes a first magnetic body,
the second housing includes a second magnetic body,
when the hinge is in an open state, causing the first housing and the second housing to be disposed side-by-side in a first direction, a magnetic force in the first direction is produced between the first magnetic body and the second magnetic body,
the first housing further includes a first housing wall,
the second housing further includes a second housing wall,
the first housing wall and the second housing wall are adjacent to each other,
the hinge extends across the first housing wall and the second housing wall when in the open state,
the first housing is provided on an end thereof with a first inclined face that forms an obtuse angle with a bottom face of the first housing,
the second housing is provided on an end thereof with a second inclined face that forms an obtuse angle with a bottom face of the second housing, and the hinge overlaps with the first inclined face and the second inclined face.

2. The electronic device according to claim 1, wherein the first magnetic body and the second magnetic body are magnets and are disposed such that, when the hinge is in an open state, different magnetic poles face each other in the first direction.

3. The electronic device according to claim 1, wherein the first housing and the second housing each include a space for storing a bending portion of the display panel in an interior thereof when the hinge is in a closed state.

4. The electronic device according to claim 1, wherein the electronic device further includes a magnetic sensor that detects an open/closed state of the hinge, based on a change in a magnetic state caused by changes in position of the first magnetic body and the second magnetic body.

5. The electronic device according to claim 1, wherein when the first hinge is in a closed state, a magnetic force is produced in a normal direction of the display panel between a magnetic body other than the first magnetic body provided to the first housing, and a magnetic body other than the second magnetic body provided to the second housing.

6. The electronic device according to claim 1, further comprising:
a third housing; and
a second hinge that is flexible and connects the second housing and the third housing, wherein
the hinge that connects the first housing and the second housing serves as a first hinge,
the rear face of the display panel faces the third housing,
the second housing further includes a third magnetic body,
the third housing includes a fourth magnetic body, and
when the second hinge is in an open state, causing the second housing and the third housing to be disposed side-by-side in the first direction, a magnetic force in the first direction is produced between the third magnetic body and the fourth magnetic body.

7. The electronic device according to claim 6, wherein the first to the third housings are disposed side-by-side in a first direction, exposing a display face in its entirety, when the first hinge and the second hinge are set to open states, and
the third housing is larger in size in the first direction than the first housing and the second housing, exposing a portion of the display face when the first hinge and the second hinge are set to a closed state and an open state, respectively.

8. The electronic device according to claim 7, wherein when the first hinge is in a closed state and the second hinge is in an open state, a magnetic force is produced in a normal direction of the display panel between a magnetic body other than the first magnetic body provided to the first housing, and a magnetic body other than the fourth magnetic body provided to the third housing.

9. The electronic device according to claim 8, wherein the display face is stored in its entirety by setting the first hinge to an open state and the second hinge to a closed state.

10. The electronic device according to claim 9, wherein, from the state where the display face is stored in its entirety, a portion of the display face is exposed by sliding the first housing in the first direction.

11. The electronic device according to claim 1, wherein the display panel includes an OLED panel.

12. The electronic device according to claim 1, further comprising:
a communication function.

13. The electronic device according to claim 1, wherein
the first housing is provided on the end thereof with a first projection that includes the first inclined face,
the first magnetic body is disposed inside the first projection,
the second housing is provided on the end thereof with a second projection that includes the second inclined face, and
the second magnetic body is disposed inside the second projection.

14. An electronic device comprising:
a first housing;
a second housing;
a hinge that is flexible and connects the first housing and the second housing; and
a display panel that is continuously flexible, wherein
the display panel includes a rear face that faces upper faces of the first housing and the second housing,
the first housing includes a first magnetic body,
the second housing includes a second magnetic body,
when the hinge is in an open state, causing the first housing and the second housing to be disposed side-by-side in a first direction, a magnetic force in the first direction is produced between the first magnetic body and the second magnetic body,
the first housing and the second housing each include a space for storing a bending portion of the display panel in an interior thereof when the hinge is in a closed state,
the first housing is provided on an end thereof with a first inclined face that forms an obtuse angle with a bottom face of the first housing, and
the second housing is provided on an end thereof with a second inclined face that forms an obtuse angle with a bottom face of the second housing.

15. The electronic device according to claim 14, wherein
the first housing includes a first housing wall,
the second housing includes a second housing wall,
the first housing wall and the second housing wall are adjacent to each other, and
the hinge extends across the first housing wall and the second housing wall when in the open state.

16. The electronic device according to claim 15, wherein the hinge includes a portion thereof positioned between the first housing wall and the display panel, and another portion thereof positioned between the second housing wall and the display panel.

17. The electronic device according to claim 14, further comprising:
a third housing; and
a second hinge that is flexible and connects the second housing and the third housing, wherein
the hinge that connects the first housing and the second housing serves as a first hinge,
the rear face of the display panel faces the third housing,
the second housing further includes a third magnetic body,
the third housing includes a fourth magnetic body, and
when the second hinge is in an open state, causing the second housing and the third housing to be disposed side-by-side in the first direction, a magnetic force in the first direction is produced between the third magnetic body and the fourth magnetic body.

18. The electronic device according to claim 17, wherein
the first to the third housings are disposed side-by-side in a first direction, exposing a display face in its entirety, when the first hinge and the second hinge are set to open states, and
the third housing is larger in size in the first direction than the first housing and the second housing, exposing a portion of the display face when the first hinge and the second hinge are set to a closed state and an open state, respectively.

19. The electronic device according to claim 14, wherein
the first housing is provided on the end thereof with a first projection that includes the first inclined face,
the first magnetic body is disposed inside the first projection,
the second housing is provided on the end thereof with a second projection that includes the second inclined face, and
the second magnetic body is disposed inside the second projection.

20. An electronic device comprising:
a first housing;
a second housing;
a third housing;
a first hinge that is flexible and connects the first housing and the second housing;
a second hinge that is flexible and connects the second housing and the third housing; and
a display panel that is continuously flexible, wherein
the display panel includes a rear face that faces upper faces of the first housing and the second housing, and faces the third housing,
the first housing includes a first magnetic body,
the second housing includes a second magnetic body and a third magnetic body,
the third housing includes a fourth magnetic body, and is larger in size in the first direction than the first and the second housings,
when the hinge is in an open state, causing the first housing and the second housing to be disposed side-by-side in a first direction, a magnetic force in the first direction is produced between the first magnetic body and the second magnetic body,
when the second hinge is in an open state, causing the second housing and the third housing to be disposed side-by-side in the first direction, a magnetic force in the first direction is produced between the third magnetic body and the fourth magnetic body,
when the first and the second hinges are set to an open state, the first to the third housings are disposed side-by-side in a first direction, exposing a display face in its entirety,
when the first hinge and the second hinge are set to a closed state and an open state, respectively, a portion of the display face is exposed,
when the first hinge is set to a closed state and the second hinge is set to an open state, a magnetic force is produced in a normal direction of the display panel between a magnetic body other than the first magnetic body provided to the first housing, and a magnetic body other than the fourth magnetic body provided to the third housing,
the first housing is provided on an end thereof with a first inclined face that forms an obtuse angle with a bottom face of the first housing, and
the second housing is provided on an end thereof with a second inclined face that forms an obtuse angle with a bottom face of the second housing.

21. The electronic device according to claim 20, wherein
the first housing includes a first housing wall,
the second housing includes a second housing wall, the first housing wall and the second housing wall are adjacent to each other, and the hinge extends across the first housing wall and the second housing wall when in the open state.

22. The electronic device according to claim 21, wherein the hinge includes a portion thereof positioned between the first housing wall and the display panel, and another portion thereof positioned between the second housing wall and the display panel.

23. The electronic device according to claim 20, wherein the first housing is provided on the end thereof with a first projection that includes the first inclined face, the first magnetic body is disposed inside the first projection, the second housing is provided on the end thereof with a second projection that includes the second inclined face, and the second magnetic body is disposed inside the second projection.

\* \* \* \* \*